US010397498B2

(12) United States Patent
Cardinaux et al.

(10) Patent No.: US 10,397,498 B2
(45) Date of Patent: Aug. 27, 2019

(54) COMPRESSIVE SENSING CAPTURING DEVICE AND METHOD

(71) Applicant: Sony Corporation, Tokyo (JP)

(72) Inventors: Fabien Cardinaux, Stuttgart (DE); Stefan Uhlich, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 56 days.

(21) Appl. No.: 15/844,739

(22) Filed: Dec. 18, 2017

(65) Prior Publication Data

US 2018/0198994 A1    Jul. 12, 2018

(30) Foreign Application Priority Data

Jan. 11, 2017    (EP) .................... 17151024

(51) Int. Cl.
H04N 5/232    (2006.01)
H04N 5/335    (2011.01)
H03M 7/30    (2006.01)
G06N 3/02    (2006.01)

(52) U.S. Cl.
CPC ........ H04N 5/3355 (2013.01); H03M 7/3062 (2013.01); H04N 5/23219 (2013.01); H04N 5/23229 (2013.01); G06N 3/02 (2013.01)

(58) Field of Classification Search
CPC ............. H04N 5/3355; H04N 5/23229; H04N 5/23219; H03M 7/3062; G06N 3/02
See application file for complete search history.

(56) References Cited

U.S. PATENT DOCUMENTS

| 7,617,436 B2 * | 11/2009 | Wenger | H04N 19/147 714/758 |
| 9,268,015 B2 | 2/2016 | Rothberg et al. | |
| 2012/0082345 A1 * | 4/2012 | Rachlin | G06K 9/6211 382/106 |
| 2013/0080092 A1 * | 3/2013 | Yogeeswaran | H02J 3/02 702/60 |
| 2017/0091655 A1 * | 3/2017 | Lin | G06N 20/00 |
| 2017/0093603 A1 * | 3/2017 | Hu | H04B 1/69 |
| 2017/0185900 A1 * | 6/2017 | Paul | G06N 20/00 |

FOREIGN PATENT DOCUMENTS

| CN | 104391295 | 3/2015 |
| GB | 2 404 511 A | 2/2005 |
| WO | WO 2016/149881 A1 | 9/2016 |

OTHER PUBLICATIONS

EPO Form 1195 issued Mar. 22, 2018 in corresponding European Patent Application No. 18151253.4, 1 page.
Extended European Search Report dated May 29, 2018 in corresponding European Patent Application No. 18151253.4 citing documents AO, AP, AX, AY and AZ therein, 11 pages.

(Continued)

Primary Examiner — Hung H Lam
(74) Attorney, Agent, or Firm — Xsensus LLP

(57) ABSTRACT

A compressive sensing capturing device has circuitry, which is configured to obtain compressive sensing image data; and to set a device attribute based on image attribute data, wherein the image attribute data are based on a machine learning algorithm performed in the compressing domain on the obtained compressive sensing image data.

20 Claims, 3 Drawing Sheets

(56) References Cited

OTHER PUBLICATIONS

Shikha Singh et al., "Deep Blind Compressed Sensing", XP55475319, Dec. 22, 2016, 10 pages, Retrieved from the Internet: URL:https://arxiv.org/ftp/arxiv/papers/1612/1612.07453.pdf.
Steffen Schneider, "A Deep Learning Approach to Compressive Sensing with Convolutional Autoencoders", XP55474645, Dec. 7, 2016, pp. 1-7, Retrieved from the Internet: URL:https://github.com/stes/compressed_sensing/blob/master/report/ report.pdf.
Amir Adler et al., "A Deep Learning Approach to Block-Based Compressed Sensing of Images", Arxiv.Org, Cornell University Library, XP80705979, Jun. 5, 2016, 5 pages.
Stephen Becker et al ."NESTA: A Fast and Accurate First-Order Method for Sparse Recovery", Siam J. Imaging Sci., vol. 4, No. 1, Jan. 6, 2011, pp. 1-37.
Yann LeCun et al. "Deep Learning", Nature, vol. 521, May 28, 2015, pp. 436-444.
Tian Jihua et al. "Motion Compensation for Compressive Sensing SAR Imaging with Autofocus", 2011 $6^{th}$ IEEE Conference on Industrial Electronics and Applications, 2011, pp. 1564-1567.
Shun-Jun Wei et al. "An Autofocus Approach for Model Error Correction in Compressed Sensing SAR Imaging", 2012 IEEE International Geoscience and Remote Sensing Symposium (IGARSS), 2012, pp. 3987-3990.

\* cited by examiner

COMPRESSIVE SENSING CAPTURING DEVICE AND METHOD

TECHNICAL FIELD

The present disclosure generally pertains to a compressive sensing capturing device and method.

TECHNICAL BACKGROUND

Generally, camera system architectures are known which are used, for example, as wearable cameras. Known cameras typically have a CMOS (Complementary Metal Oxide Semiconductor) image sensor, CCD (Charge Coupled Device) image sensor, or the like.

Moreover, in digital imaging it is known to directly measure, for example, the intensity of a scene with a pixel array sensor which is based on the CMOS, CCD or similar technology mentioned above. In contrast to direct measuring, where every pixel of the sensor is read out, other methods are known, such as compressive sensing.

Compressive sensing (CS) is a signal processing method which typically allows capturing and representing signals with a small number of measurements. CS is useful for image capturing devices (e.g. for lifelog applications) as it allows to reduce battery usage and required storage.

However, in CS, typically, the original image is not available and a computationally intensive reconstruction has to be run in order to retrieve it.

Although there exist techniques for using compressive sensing in digital imaging, it is generally desirable to improve compressive sensing capturing devices and methods.

SUMMARY

According to a first aspect, the disclosure provides a compressive sensing capturing device including circuitry configured to obtain compressive sensing image data; and set a device attribute based on image attribute data, wherein the image attribute data are based on a machine learning algorithm performed in the compressing domain on the obtained compressive sensing image data.

According to a second aspect, the disclosure provides a compressive sensing capturing method, including obtaining compressive sensing image data; and setting a device attribute based on image attribute data, wherein the image attribute data are based on a machine learning algorithm performed in the compressing domain on the obtained compressive sensing image data.

Further aspects are set forth in the dependent claims, the following description and the drawings.

BRIEF DESCRIPTION OF THE DRAWINGS

Embodiments are explained by way of example with respect to the accompanying drawings, in which.

DETAILED DESCRIPTION OF EMBODIMENTS

Figure 1:
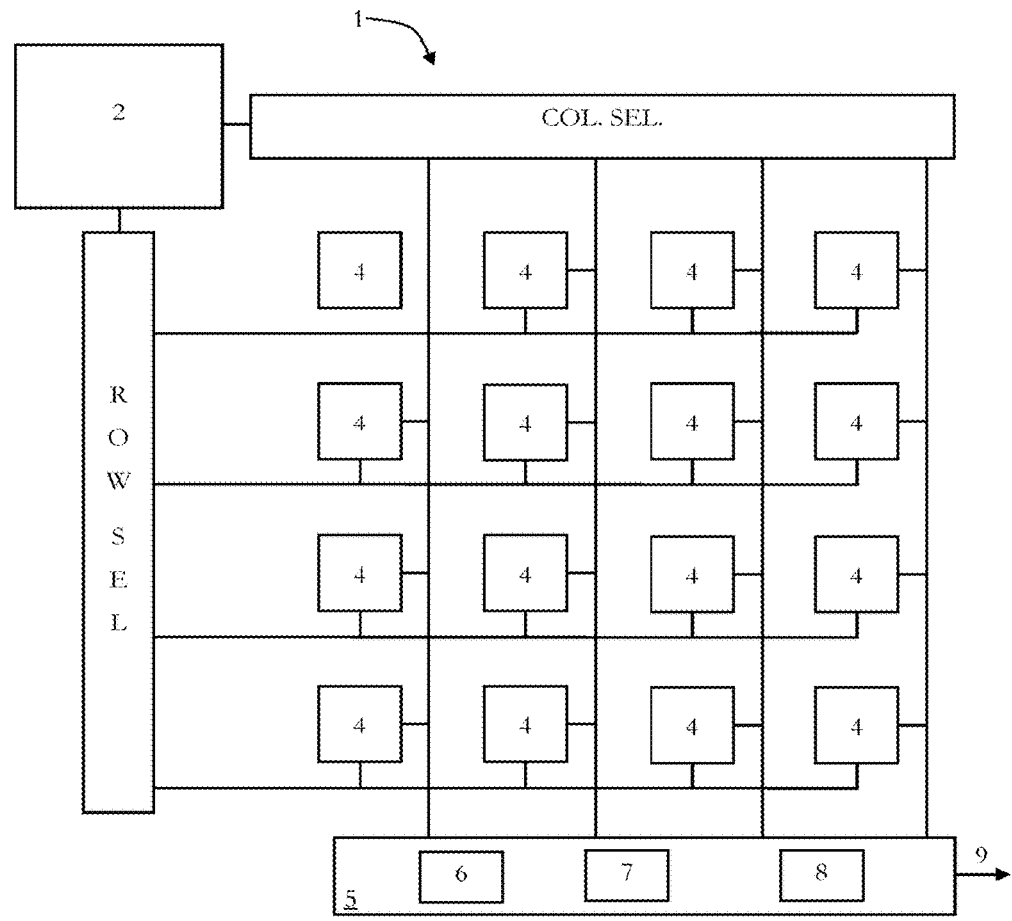
FIG. 1 illustrates an embodiment of an image sensor.

Before a detailed description of the embodiments under reference of FIG. 1, general explanations are made.

As mentioned in the outset, camera system architectures are known, which are used, for example, as wearable cameras, smartphones, or the like. Known cameras typically have a CMOS (Complementary Metal Oxide Semiconductor) image sensor, CCD (Charge Coupled Device) image sensor, or the like.

In contrast to direct measuring, where every pixel of the sensor is read out, other methods are known, such as compressive sensing. Compressive sensing (CS) is a signal processing method which allows capturing and representing signals with a small number of measurements. CS is especially useful for image capturing devices (e.g. for lifelog applications), as it allows to reduce battery usage and required storage.

CS is based on the principle that a signal that is sparse in a domain (time domain, spatial domain, etc.) can be accurately recovered from much fewer samples as compared to the original number of samples in the sparse domain. A signal is sparse if it contains a small number of nonzero components relative to the total signal length. In other words, the signal is mostly zero. The principles of compressive sensing and of sparsity are well known in the art.

However, after applying CS the original image is not available and a computationally intensive reconstruction has to be run in order to retrieve it again. The reconstruction may be based on an optimization process, e.g. based on l1-norm-approximation, or by using deep neural networks. An example is the so-called NESTA approach (S. Becker et al., "Nesta: A Fast and Accurate First-Order Method for Sparse Recovery", SIAM J. Imaging Sci., 4(1), 1-39. (39 pages), 6 Jan. 2011) or any other approach which is known in the art, e.g. matching pursuit algorithms, orthogonal matching pursuit algorithms, etc. Hence, in the prior art, this typically prohibits many algorithms from being directly used on the capturing device (e.g., edge blur measurement) and, therefore, applying them for automatic camera features (e.g., autofocus) may not be easy.

Conventional cameras typically feature automatic functions such as autofocus, but also others, e.g. auto-adjust of luminance, aperture size and the like, etc. However, traditional algorithms are applied on raw images and cannot be used with a CS camera, since, as mentioned, after application of the CS the image is not present anymore, but only a CS representation from which the image has to be reconstructed.

Typically, e.g. for implementing a passive autofocus feature, the blurriness of the original image is to be measured (e.g. by contrast detection). Modern digital cameras also use advanced features to adjust the focus such as the detection and tracking of the faces and special objects. In some embodiments, these features are not directly available in the images that are captured by the CS Camera. A possible solution would be to reconstruct the original image with CS methods, as mentioned above, and then to use traditional algorithms to perform the automatic functions for the device, but this would be prohibitively slow for functions like autofocus and is also not battery efficient, since the reconstruction of the CS data is rather computational intensive, as mentioned above.

Hence, some embodiments, pertain to the idea of using machine learning in the compressed domain which enables automatic features for CS capturing devices, such that, for example, automatic picture camera/video camera features may be implemented. By using machine learning, in some embodiments, image features, e.g. the blurriness, is directly measured based on the compressed measurements and therefore a faster automatic adjustment, e.g. of the autofocus, may be achieved.

Consequently, some embodiments pertain to a compressive sensing capturing device, including circuitry configured to obtain compressive sensing image data, and to set a device attribute based on image attribute data, wherein the image attribute data are based on a machine learning algorithm performed in the compressing domain on the obtained compressive sensing image data.

As mentioned, compressive sensing is generally known and the compressive sensing capturing device or its circuitry may be configured to generate compressive sensing image data.

The compressive sensing capturing device may be a digital (video) camera, a smartphone, a laptop computer, a tablet computer, a personal computer, a wearable electronic device, electronic glasses, or the like.

The circuitry may include one or more processors, logical circuits, memory (read only memory, random memory, etc., storage, e.g. hard disk, compact disc, flash drive, etc.), an interface for (wireless, e.g. Bluetooth, infrared) communication via a network (local area network, wireless network, internet), an image sensor, which may be based on CCD or CMOS technology mentioned above, etc.

The compressive sensing image data may be obtained, for example, via the interface, from a memory, from inside the device or from outside, etc. The compressive sensing image data may also be generated by the image sensor, for example.

The compressive sensing image data are based on the compressive sensing approach mentioned above. In some embodiments no reconstruction method is performed on the compressive sensing image data before the device attribute is set on the basis of this compressive sensing image data. The compressive sensing image data may origin from an image sensor which takes one or more images and generates the compressive sensing image data. Hence, the compressive sensing image data may represent one or more images, while the compressive sensing image data may even represent only parts of an image, e.g. blocks or the like, in some embodiments.

The device attribute may include at least one of: autofocus, luminance, shutter speed, aperture size, shoot mode, flash mode, object detected, etc. In some embodiments, the device attribute is used to further control the CS capturing device, e.g. optical elements for autofocus, aperture size for illumination, shutter speed for setting illumination time, tracking an object for autofocus, etc.

The image attribute data, which are used to set the device attribute, are derived with a machine learning algorithm which is performed in the compressing domain on the obtained compressive sensing image data. For example, the machine learning algorithm may be based on a support vector machine (SVM), an artificial neural network, e.g. a convolutional neural network (CNN) or the like, wherein the disclosure herein basically exemplary discusses the convolutional neural network as an example of machine learning algorithm without limiting the disclosure to convolutional neural networks.

The machine learning algorithm may be trained in advance, in some embodiments. For example, default images having defined image attributes, e.g. defined blur, defined objects, defined contrast, defined brightness, etc., may be used for generating the compressive sensing data and for training the machine learning algorithm. In some embodiments, the compressive sensing image data may be reconstructed and based on the reconstructed image a feedback is given to the machine learning algorithm for training of the machine learning algorithm.

The machine learning algorithm may include specific characteristics, classes or the like. In some embodiments, the machine learning algorithm is specialized to identify a specific image attribute, such as identifying predefined objects (people, houses, food, pet, etc.), identifying blur, contrast, brightness, identifying faces, smile in the face, sad face, lucky face, identifying eyes, etc. in the compressive sensing image data. In some embodiments, the machine learning algorithm is able to detect multiple image attributes and the image attribute data is representative of at least one image attribute.

As mentioned, in some embodiments, the machine learning algorithm is based on an artificial, e.g. convolutional neural network using compressive sensing image data as input. The compressive sensing image data may be block-based. In some embodiments, the image sensor may provide the compressive sensing image data block-based, e.g. since one image is divided into multiple blocks, which may be an intrinsic feature of a block-based compressive sensing algorithm. In some embodiments, each single block of the multiple blocks included in the compressive sensing image data is used as input for the artificial, e.g. convolutional neural network. For each block of compressive sensing image data at least one measurement is provided to the artificial, e.g. convolutional neural network, wherein in some embodiments at least two different measurements may be provided to the artificial, e.g. convolutional neural network, wherein, for example, the different measurements result from applying respective compressive sensing matrices, as it is known from compressive sensing.

As mentioned, the circuitry may further include a compressive imaging sensor, which provides compressing sensing image data and the device may be configured as digital camera, which may be configured to capture still images and/or moving (video) images.

As also mentioned, above, the circuitry may be further configured to control the image sensor (or the device) based on the set device attribute.

Some embodiments pertain to a compressive sensing capturing method, which may be performed by the compressive sensing capturing device described herein, any other electronic device or a processor or other computing means. The method includes obtaining compressive sensing image data; and setting a device attribute based on image attribute data, wherein the image attribute data are based on a machine learning algorithm performed in the compressing domain on the obtained compressive sensing image, as discussed above. As mentioned, the device attribute may include at least one of: auto focus, luminance, shutter speed, aperture size, shoot mode, flash mode, object detected. The machine learning algorithm may be based on an artificial, e.g. convolutional neural network using compressive sensing mage data as input, as discussed above, without limiting the present disclosure in that regard (see discussion above). The compressive sensing image data may be block-based, wherein one block of compressive sensing image data may be used as input for the artificial, e.g. convolutional neural network, as discussed above. For each block of compressive sensing image data at least one measurement is provided to the artificial, e.g. convolutional neural network, wherein in some embodiments at least two different measurements are provided to the artificial, e.g. convolutional neural network.

The method may include generating the image attribute data by performing the machine learning algorithm, which also be trained in advance, as discussed above. The image attribute data may be generated by performing the machine learning algorithm on the obtained compressive sensing image data, which may be obtained from a compressive imaging sensor, as discussed above. The image sensor may be controlled based on the set device attribute.

Returning to FIG. 1, an exemplary compressive sensing image sensor 1 is schematically illustrated, which is based on the CMOS technology. The image sensor 1 has a controller 2, and several pixels 4 which are arranged in a pixel array in a sensor plane. Each pixel 4 is coupled to the controller 2 via a column selection (col. sel.) and a row selection (row sel.), via which each pixel is individually selectable by the controller 2. The output from the pixels 4 is fed into a read out circuit 5 having exemplary a sign inverter 6, an analog adder 7 and an ADC 8 (Analog to Digital Converter). The output from the pixels 4 are fed to the sign inverter, then into the analog adder 7 and from the analog adder 7 the image data read out from the pixels 4 are fed into the ADC 8 from which image data 9 are output by the compressive sensing image sensor 1, which are assumed to be compressive sensing image data in this embodiment.

Figure 2:
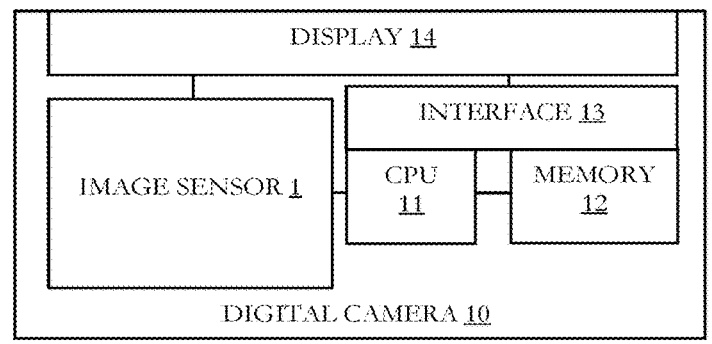
FIG. 2 illustrates a digital camera having the image sensor of FIG. 1.

FIG. 2 illustrates a compressive sensing capturing device, which is configured as a digital camera 10 in this embodiment. The digital camera 10 has the image sensor 1, which feds the compressive sensing image data to a CPU 11 (Central Processing Unit). Moreover, a memory 12, an interface 13 and a display 14 are provided, which are also coupled to the CPU 11.

The memory 12 includes a storage media, e.g. a flash drive, as well as a working memory which may have a random access memory section and a read-only memory section.

The interface 13 is configured to provide an external communication, e.g. vie a USB (universal serial bus), a wireless network connection, a Bluetooth connection or the like.

The display 14 is configured as a touch display for controlling the digital camera 10 and displaying images, without limiting the present disclosure in that regard (the display may be based on LCD (liquid crystal display), (O)LED (/organic) light emitting diode), etc. technology).

Figure 3:
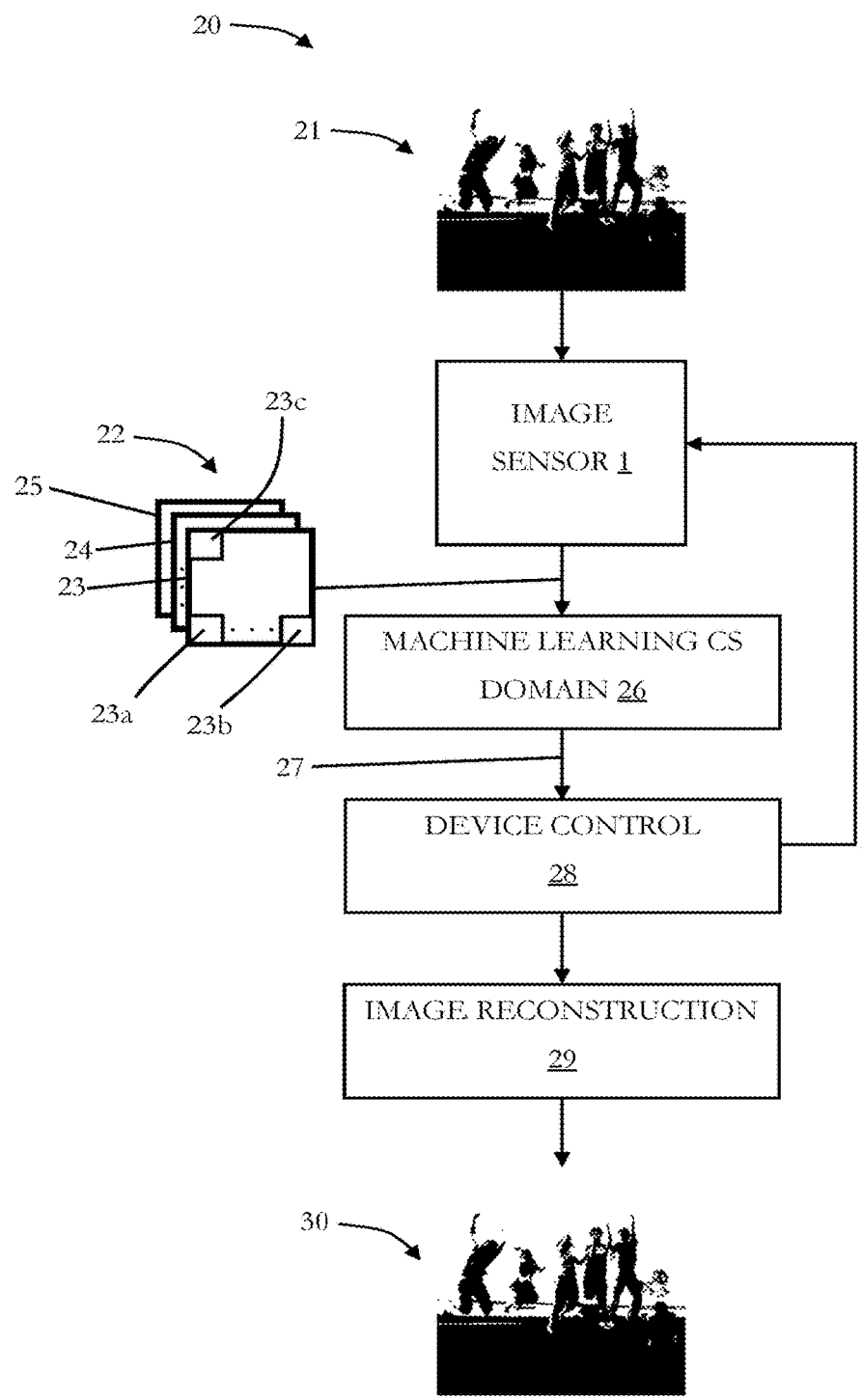
FIG. 3 illustrates a process scheme which can be executed by the digital camera of FIG. 2.

FIG. 3 illustrates a processing scheme 20 which may be performed by the digital camera 2 (image sensor 1 and CPU 11, for example) of FIG. 2.

A real world scene 21 is photographed and the image sensor 1 takes an image of the real world scene 21 and outputs compressed sensing image data 22. The compressive sensing image data 22 includes three image maps 23, 24, 25 without limiting the disclosure in that regard. The three image maps 23, 24 and 25 correspond to three different measurements which are based on a block-based compressive sensing. Each image map 23, 24 and 25 includes multiple blocks from the block-based compressive sensing method, wherein exemplary three blocks 23a, 23b and 23c are illustrated in FIG. 3. Hence, in the present embodiment, the compressive sensing image data 22 includes data which may be organized in a tensor-like structure, wherein blocks are vertically and horizontally arranged within one image map (e.g. x- and y-axis), e.g. image map 23, and different measurements, e.g. image maps 24 and 25, are arranged in a third dimension (z-axis).

The compressive sensing image data 21 are fed to a machine learning algorithm 26 which, thus, works in the compressive sensing domain, since the compressive sensing image 21 are not reconstructed before they are input into the machine learning algorithm.

As discussed, a possible machine learning method that can be used is a convolution neural network (CNN) with the compressed measurement, i.e. the compressive sensing image data 21, as input. As mentioned, when measurements, i.e. compressive sensing image data 21, are acquired from block based compressed sensing, it is possible to arrange the measurements in a three-dimensional tensor where the two first dimensions are the horizontal and vertical blocks and the last dimension (depth dimension) corresponds to each measurement of the corresponding block.

Using the traditional CNN terms, each input map 23, 24, 25 corresponds to one measurement for each block. This arrangement allows to preserve the spatial integrity of the original image and is suited for the CNN design.

Figure 4:
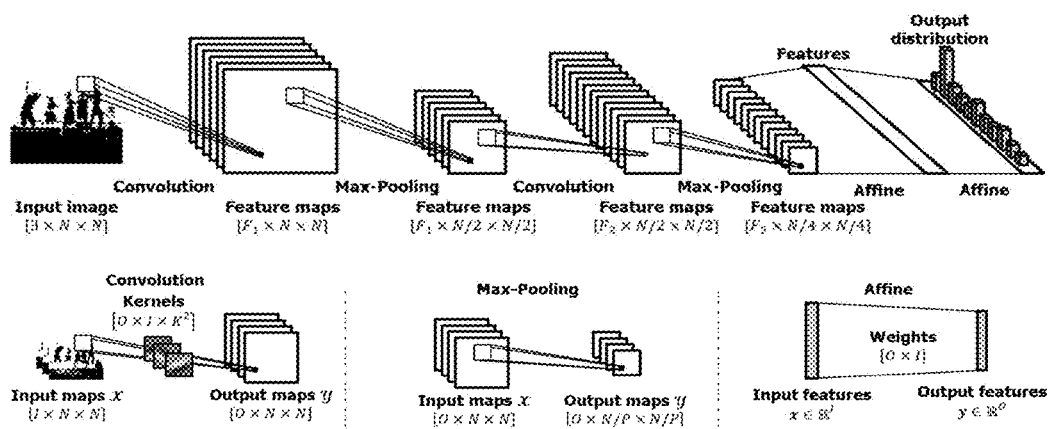
FIG. 4 visualized the application of a convolutional neural network.

The principle of the usage of the CNN at 26 is also illustrated in FIG. 4, which shows generally in the first line the CNN structure, and in the second line the basic principle of building blocks. The principles of a CNN and its application in imaging is generally known and, thus, it is only briefly discussed in the following under reference of FIG. 4.

The input image includes for example three maps or layers (exemplary red, green and blue (RGB) color information) and N times N blocks. The CNN has a convolutional layer and a subsequent pooling layer, wherein this structure can be repeated as also shown in FIG. 4. The convolutional layer includes the neurons. By applying a filter kernel (sec convolution kernels in the second line) on the input image, a respective feature map can be obtained. The pooling layer, which is based in the present embodiment on the Max-Pooling (see second line, "Max-Pooling), takes the information of the most active neurons of the convolution layer and discards the other information. After several repetitions (three in FIG. 4), the process ends with a fully-connected layer, which is also referred to as affine layer. The last layer includes typically a number of neurons, which corresponds to the number of object classes (output features) which are to be differentiated by the CNN. The output is illustrated in FIG. 4, first line, as an output distribution, wherein the distribution is shown by a row of columns, wherein each column represents a class and the height of the column represents the weight of the object class. The different classes correspond to the output or image attribute features which may be represented by the image attribute data 27, which are output by the CNN 26. The classes are, for example, "people, car, truck, etc." Typically several hundred or several thousand of classes can be used. In some embodiments, the CNN 26 outputs a feature map with estimated classes and/or blur radius values for each image pixel (location), which may be particularly useful in embodiments pertaining applications such as autofocus.

The output of the CNN 26 is used by a device control 28 (e.g. formed by the CPU 11 in FIG. 2) to set one or more device attributes, such that at least one of the following can be realized: autofocus, auto-adjustment of luminance/shutter speed/aperture size, auto-choosing of shoot mode for picture/video mode, auto-choosing of flash mode, capture picture if smile is detected, capture picture if face is detected, capture picture if pet is detected, etc.

For example, the autofocus function can be implemented by detecting an object, such as a face, and detecting the blur of the face with the CNN 26 and setting the device attribute such that the detected object (e.g. face) is automatically focused (and thereby a autofocus feature of the digital camera 10 is implemented). Hence, for example, the blurriness is directly measured in the compressive sensing domain based on the compressive sensing image data 21, which are directly used as input to the CNN 26. As discussed above, as the blurriness is measured without reconstructing the compressive sensing image, the digital camera 10 may be provide a faster autofocus.

Similarly, the other camera features or device attributes may be realized. For example, the auto-adjustment of the luminance/shutter speed/aperture size may be based on the measurement of brightness and/or contrast in the compressive sensing image data and based on the CNN 26, etc. The skilled person knows which image features are to be extracted for providing respective device attributes or camera features and, thus, the skilled person is able to provide a respective CNN which is able to extract the needed image attribute data which are needed for setting a respective device attribute(s).

After having set the device attribute accordingly, the device control 28 controls the images sensor 1 to output compressive sensing image data 2,1 which are reconstructed at 29, thereby generating a respective output image 30, which may be displayed on display 14, for example.

Figure 5:
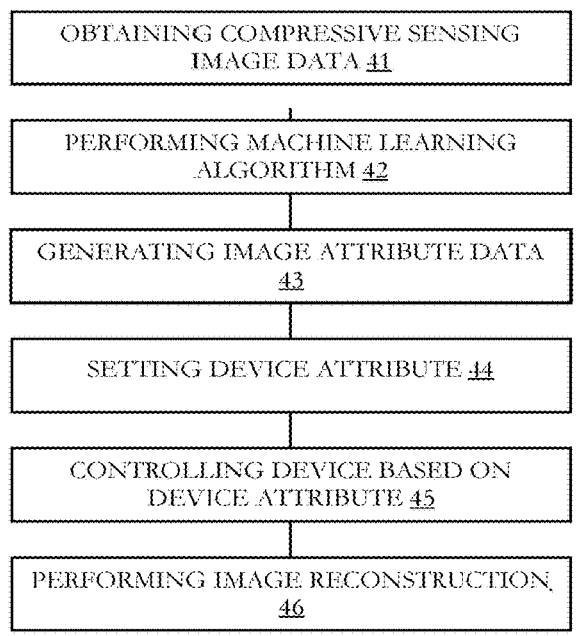
FIG. 5 is a flowchart of an embodiment of a compressive sensing capturing method.

In the following a compressive sensing capturing method 40 is discussed under reference of FIG. 5.

At 41, compressive sensing image data are obtained, for example, from the image sensor 1, as discussed above.

On the obtained compressive sensing image data, a machine learning algorithm, such as CNN, SVM or the like as discussed above, is performed at 42, whereby image attribute data are generated at 43.

The image attributes included in the image attribute data may be based on the classes including weights as output by the CNN without limiting the present disclosure to this specific example.

At 44, one or more device attributes are set, as mentioned above, such as the autofocus, face-detection, smile-detection, etc.

At 45, the device is controlled based on the device attribute set at 45. For example, the autofocus is controlled for an object, an image is taken if a smile is detected, etc.

At 46, the image, which is taken at 45, is reconstructed based on the compressive sensing image data which are obtained, e.g. from the image sensor 41.

Hence, by using machine learning techniques that directly operate with the compressed measurements, some embodiments avoid to perform a CS reconstruction of the original image. By avoiding such a reconstruction step, which is computationally intensive, e.g. applications where a real-time automatic feature of a device may be improved in some embodiments, as discussed above.

The methods as described herein are also implemented in some embodiments as a computer program causing a computer and/or a processor to perform the method, when being carried out on the computer and/or processor. In some embodiments, also a non-transitory computer-readable recording medium is provided that stores therein a computer program product, which, when executed by a processor, such as the processor described above, causes the methods described herein to be performed.

It should be recognized that the embodiments describe methods with an exemplary ordering of method steps. The specific ordering of method steps is however given for illustrative purposes only and should not be construed as binding.

All units and entities described in this specification and claimed in the appended claims can, if not stated otherwise, be implemented as integrated circuit logic, for example on a chip, and functionality provided by such units and entities can, if not stated otherwise, be implemented by software.

In so far as the embodiments of the disclosure described above are implemented, at least in part, using software-controlled data processing apparatus, it will be appreciated that a computer program providing such software control and a transmission, storage or other medium by which such a computer program is provided are envisaged as aspects of the present disclosure.

Note that the present technology can also be configured as described below.

(1) A compressive sensing capturing device, comprising circuitry configured to:
obtain compressive sensing image data; and
set a device attribute based on image attribute data, wherein the image attribute data are based on a machine learning algorithm performed in the compressing domain on the obtained compressive sensing image data.

(2) The compressive sensing capturing device of (1), wherein the device attribute includes at least one of: auto focus, luminance, shutter speed, aperture size, shoot mode, flash mode, object detected.

(3) The compressive sensing capturing device of (1) or (2), wherein the machine learning algorithm is based on an artificial neural network using the obtained compressive sensing mage data as input.

(4) The compressive sensing capturing device of (3), wherein the compressive sensing image data are block-based.

(5) The compressive sensing capturing device of (4), wherein one block of compressive sensing image data is used as input for the artificial neural network.

(6) The compressive sensing capturing device of (5), wherein for each block of compressive sensing image data at least two different measurements are provided to the artificial neural network.

(7) The compressive sensing capturing device of anyone of (1) to (6), wherein the circuitry further comprises a compressive imaging sensor.

(8) The compressive sensing capturing device of (7), wherein the device is configured as digital camera.

(9) The compressive sensing capturing device of (7) or (8), wherein the compressive sensing image data are obtained from the compressive imaging sensor.

(10) The compressive sensing capturing device of anyone of (7) to (9), wherein the circuitry is further configured to control the image sensor based on the set device attribute.

(11) A compressive sensing capturing method, comprising:
obtaining compressive sensing image data; and
setting a device attribute based on image attribute data, wherein the image attribute data are based on a machine learning algorithm performed in the compressing domain on the obtained compressive sensing image data.

(12) The compressive sensing capturing method of (11), wherein the device attribute includes at least one of: auto focus, luminance, shutter speed, aperture size, shoot mode, flash mode, object detected.

(13) The compressive sensing capturing method of (11) or (12), wherein the machine learning algorithm is based on an artificial neural network using the obtained compressive sensing mage data as input.

(14) The compressive sensing capturing method of (13), wherein the compressive sensing image data are block-based.

(15) The compressive sensing capturing method of (14), wherein one block of compressive sensing image data is used as input for the artificial neural network.

(16) The compressive sensing capturing method of (15), wherein for each block of compressive sensing image data at least two different measurements are provided to the artificial neural network.

(17) The compressive sensing capturing method of anyone of (11) to (16), further comprising generating the image attribute data

(18) The compressive sensing capturing method of (17), wherein the image attribute data are generated by performing the machine learning algorithm on the obtained compressive sensing image data.

(19) The compressive sensing capturing device of anyone of (11) to (18), wherein the compressive sensing image data are obtained from a compressive imaging sensor.

(20) The compressive sensing capturing device of (19), further comprising controlling the image sensor based on the set device attribute.

(21) A computer program comprising program code causing a computer to perform the method according to anyone of (11) to (20), when being carried out on a computer.

(22) A non-transitory computer-readable recording medium that stores therein a computer program product, which, when executed by a processor, causes the method according to anyone of (11) to (20) to be performed.

The present application claims priority to European Patent Application 17151024.1 filed by the European Patent Office on 11 Jan. 2017, the entire contents of which being incorporated herein by reference.

The invention claimed is:

1. A compressive sensing capturing device, comprising circuitry configured to:
obtain compressive sensing image data; and
set a device attribute based on image attribute data, wherein the image attribute data are based on a machine learning algorithm performed in the compressing domain on the obtained compressive sensing image data.

2. The compressive sensing capturing device of claim 1, wherein the device attribute includes at least one of: autofocus, luminance, shutter speed, aperture size, shoot mode, flash mode, object detected.

3. The compressive sensing capturing device of claim 1, wherein the machine learning algorithm is based on an artificial neural network using the obtained compressive sensing image data as input.

4. The compressive sensing capturing device of claim 3, wherein the compressive sensing image data are block-based.

5. The compressive sensing capturing device of claim 4, wherein one block of compressive sensing image data is used as input for the artificial neural network.

6. The compressive sensing capturing device of claim 5, wherein for each block of compressive sensing image data at least two different measurements are provided to the artificial neural network.

7. The compressive sensing capturing device of claim 1, wherein the circuitry further comprises a compressive imaging sensor.

8. The compressive sensing capturing device of claim 7, wherein the device is configured as digital camera.

9. The compressive sensing capturing device of claim 7, wherein the compressive sensing image data are obtained from the compressive imaging sensor.

10. The compressive sensing capturing device of claim 7, wherein the circuitry is further configured to control the image sensor based on the set device attribute.

11. A compressive sensing capturing method, comprising:
obtaining compressive sensing image data; and
setting a device attribute based on image attribute data, wherein the image attribute data are based on a machine learning algorithm performed in the compressing domain on the obtained compressive sensing image data.

12. The compressive sensing capturing method of claim 11, wherein the device attribute includes at least one of: autofocus, luminance, shutter speed, aperture size, shoot mode, flash mode, object detected.

13. The compressive sensing capturing method of claim 11, wherein the machine learning algorithm is based on an artificial neural network using the obtained compressive sensing image data as input.

14. The compressive sensing capturing method of claim 13, wherein the compressive sensing image data are block-based.

15. The compressive sensing capturing method of claim 14, wherein one block of compressive sensing image data is used as input for the artificial neural network.

16. The compressive sensing capturing method of claim 15, wherein for each block of compressive sensing image data at least two different measurements are provided to the artificial neural network.

17. The compressive sensing capturing method of claim 11, further comprising generating the image attribute data.

18. The compressive sensing capturing method of claim 17, wherein the image attribute data are generated by performing the machine learning algorithm on the obtained compressive sensing image data.

19. The compressive sensing capturing device of claim 11, wherein the compressive sensing image data are obtained from a compressive imaging sensor.

20. The compressive sensing capturing device of claim 19, further comprising controlling the image sensor based on the set device attribute.

* * * * *